(12) United States Patent
Zhong et al.

(10) Patent No.: US 11,029,376 B2
(45) Date of Patent: Jun. 8, 2021

(54) RADIO-FREQUENCY COIL FOR MAGNETIC RESONANCE DEVICE

(71) Applicant: Hefei Institutes of Physical Science, Chinese Academy of Sciences, Anhui (CN)

(72) Inventors: Kai Zhong, Anhui (CN); Hongyi Yang, Anhui (CN)

(73) Assignee: Hefei Institutes of Physical Science, Chinese Academy of Sciences, Hefei (CN)

( * ) Notice: Subject to any disclaimer, the term of this patent is extended or adjusted under 35 U.S.C. 154(b) by 0 days.

(21) Appl. No.: 16/499,034

(22) PCT Filed: Dec. 26, 2017

(86) PCT No.: PCT/CN2017/118571
§ 371 (c)(1),
(2) Date: Sep. 27, 2019

(87) PCT Pub. No.: WO2018/176940
PCT Pub. Date: Oct. 4, 2018

(65) Prior Publication Data
US 2020/0041586 A1 Feb. 6, 2020

(30) Foreign Application Priority Data
Mar. 28, 2017 (CN) .......................... 201710191106.8

(51) Int. Cl.
*G01R 33/341* (2006.01)
*G01R 33/34* (2006.01)
*G01R 33/36* (2006.01)

(52) U.S. Cl.
CPC ..... *G01R 33/341* (2013.01); *G01R 33/34046* (2013.01); *G01R 33/36* (2013.01)

(58) Field of Classification Search
CPC . G01R 33/341; G01R 33/34046; G01R 33/36
See application file for complete search history.

(56) References Cited

U.S. PATENT DOCUMENTS 5,315,251 A * 5/1994 Derby ................ G01R 33/3678
324/318
5,515,855 A * 5/1996 Meyer .............. G01R 33/34046
324/318

(Continued)

FOREIGN PATENT DOCUMENTS

CN 2824058 Y 10/2006
EP 0148566 A1 7/1985

(Continued)

OTHER PUBLICATIONS

"European Application Serial No. 17903814.6, Search Report dated Apr. 1, 2020", (Apr. 1, 2020), 10 pgs.

(Continued)

*Primary Examiner* — Dixomara Vargas
(74) *Attorney, Agent, or Firm* — Schwegman Lundberg & Woessner, P.A.

(57) ABSTRACT

The present disclosure relates to a radio-frequency coil for a magnetic resonance device, comprising: antenna units, conductor end ring segments connecting the antenna units, and capacitors. Here, a single antenna unit is curved in a plane parallel to a direction of a static magnetic field $B_0$ (the positive direction of the z axis); the cross sections of all the antenna units in a x-y plane are spaced apart from each other at an angle and distributed symmetrically in a radial array; adjacent antenna units are connected with the end ring segments and the capacitors at two ends; the coil as a whole is an open dome shape surface structure and is sufficiently conformal to the surface of an object to be scanned.

17 Claims, 5 Drawing Sheets

(56) References Cited

U.S. PATENT DOCUMENTS

| | | | | |
|---|---|---|---|---|
| 5,565,780 | A * | 10/1996 | Derby | G01R 33/34046 324/318 |
| 5,682,893 | A * | 11/1997 | Meyer | G01R 33/34046 324/318 |
| 5,699,802 | A | 12/1997 | Duerr | |
| 6,344,745 | B1 * | 2/2002 | Reisker | G01R 33/34046 324/318 |
| 6,727,701 | B1 | 4/2004 | Jevtic et al. | |
| 6,788,058 | B1 * | 9/2004 | Petropoulos | G01R 33/34046 324/318 |
| 6,831,460 | B2 * | 12/2004 | Reisker | G01R 33/34046 324/318 |
| 7,250,764 | B2 * | 7/2007 | Tropp | A61B 5/055 324/309 |
| 8,148,986 | B2 * | 4/2012 | Driesel | G01R 33/34046 324/318 |
| 2003/0071622 | A1 * | 4/2003 | Reisker | G01R 33/34046 324/318 |
| 2005/0059882 | A1 * | 3/2005 | Tropp | A61B 5/055 600/422 |
| 2009/0096553 | A1 * | 4/2009 | Driesel | G01R 33/345 333/219 |
| 2009/0121715 | A1 | 5/2009 | Guan et al. | |
| 2016/0209481 | A1 * | 7/2016 | Gunamony | G01R 33/3415 |
| 2018/0369601 | A1 * | 12/2018 | Saitoh | A61N 2/02 |
| 2020/0230431 | A1 * | 7/2020 | Saitoh | A61N 1/40 |
| 2020/0292644 | A1 * | 9/2020 | Hou | G01R 33/34007 |

FOREIGN PATENT DOCUMENTS

| | | |
|---|---|---|
| EP | 0758092 A1 | 2/1997 |
| JP | H01238849 A | 9/1989 |
| JP | H10155764 A | 6/1998 |
| JP | 2001145608 A | 5/2001 |
| WO | WO-2005050236 A1 | 6/2005 |

OTHER PUBLICATIONS

Shrinivasan, R., et al., "A new quadrature coil for neurovascular MR imaging", Proc. Soc. Magn. Resonance. vol. 3, (Aug. 6, 1994), 1106.

"International Application Serial No. PCT/CN2017/118571, International Search Report dated Apr. 8, 2018", 2 pgs.

"International Application Serial No. PCT/CN2017/118571, Written Opinion dated Apr. 8, 2018", 3 pgs.

"European Application Serial No. 17903814.6, Office Action dated Jan. 21, 2021", (Jan. 21, 2021), 10 pgs.

* cited by examiner

RADIO-FREQUENCY COIL FOR MAGNETIC RESONANCE DEVICE

PRIORITY APPLICATIONS

This application is a U.S. National Stage Filing under 35 U.S.C. 371 from International Application No. PCT/CN2017/118571, filed on Dec. 26, 2017, and published as WO2018/176940 on Oct. 4, 2018, which claims the benefit of priority to Chinese Application No. 201710191106.8, filed on Mar. 28, 2017; the benefit of priority of each of which is hereby claimed herein, and which applications and publications are hereby incorporated herein by reference in their entirety.

TECHNICAL FIELD

The present disclosure relates to a radio-frequency coil for a magnetic resonance imaging (MRI) device, and particularly to a radio-frequency coil applied to brains of humans, monkeys, rats and mice.

BACKGROUND

Magnetic resonance is a following physical phenomenon: some nucleuses have a nuclear magnetic moment $\mu$, and if a static magnetic field $B_0$ is applied externally, the nuclear magnetic moment $\mu$ will precess about the $B_0$ direction at a Larmor frequency of $f\lambda$ depending on the magnitude of $B_0$, and an energy level splitting will occur. If a radio-frequency magnetic field $B_1$ perpendicular to the $B_0$ direction and with the same frequency of $f\lambda$ is further externally applied, the nucleuses can absorb the radio-frequency energy and be excited from a lower energy level to a higher energy level. The nucleuses will transition from the higher energy level back to the stable lower energy level again spontaneously and radiate an electromagnetic wave with the same frequency of $f\lambda$. A magnetic resonance radio-frequency coil (abbreviated as coil hereinafter) is an antenna which emits and receives such an electromagnetic wave in the magnetic resonance phenomenon.

Magnetic resonance imaging is a technology which acquires an internal tomographic image of an object by making use of the magnetic resonance phenomenon. When a gradient magnetic field is added to $B_0$ such that the Lamor frequency varies in space, a corresponding cross section may be selected by selecting frequency. The coil emits an electromagnetic wave with a resonance frequency required for exciting the selected cross section, then receives a signal radiated from the corresponding cross section. The signal is then subjected to spatial Fourier transform by a computer to construct an image of the selected cross section.

In the magnetic resonance imaging, the signal to noise ratio of the image and the homogeneity of the radio-frequency field excited by the coil are two very critical quality indexes, both of which are directly related to the coil. The coils can be classified as body coils and surface coils (also known as local coils). A body coil covers a relatively large spatial region, is mostly used as a transmitting coil, and can excite a relatively homogeneous radio-frequency magnetic field. However, the body coil has relatively more noise signals when used as a receiving coil. A surface coil is directly placed on a local surface of an object to be scanned, and the homogeneity of the radio-frequency magnetic field excited to thereby is not as good as that of the body coil. However, because the surface coil is in close proximity to the scanning region of interest, the received signal is relatively strong, and the coil is relatively small, so the noise is relatively small, as a result, the signal to noise ratio thereof is higher than that of the body coil.

Traditional radio-frequency coils used for magnetic resonance imaging of brain are birdcage coils, one kind of body coils. Such a coil is not convenient for performing operations such as anesthesia and surgery on an object to be scanned due to its relatively closed space. In a high field magnetic resonance imaging, the Lamor frequency $f\lambda$ is higher than that in a low field, and the corresponding wavelength is shorter. A large-size birdcage coil will influence the homogeneity of the radio-frequency field due to the standing wave effect, and signals at two ends of the coil are weaker than those at the center. And, at two ends of the birdcage coil, the coil cannot be sufficiently in proximity to some non-cylindrical objects to be scanned which have curved surfaces, such as heads of humans, monkeys, rats and mice. Furthermore, in addition to brain, other tissue structures such as mouth cavity and maxilla also occupy the coil space, such that the filling ratio of the coil is not high and more noises are introduced, resulting in a lower signal to noise ratio of the image than that of the surface coil.

SUMMARY

The technical problem to be solved by the present disclosure is to design a radio-frequency surface coil for a magnetic resonance, which can be sufficiently in close proximity to brains of humans, non-human primates, rats or mice to be scanned or similar objects to be scanned which have curved surfaces, and can obtain higher homogeneity of the radio-frequency field and higher signal to noise ratio of the magnetic resonance image.

The technical problem can be solved by the following technical solutions of the present disclosure.

1. A radio-frequency coil for a magnetic resonance device, comprising:
   i. 2n of curved antenna units, wherein n is an integer of 1 or more;
   ii. conductor end ring segments connected to two ends of the antenna units; and
   iii. capacitors connecting adjacent end ring segments,
   wherein each antenna unit of the 2n of antenna units is curved the same as or similar to each other in a plane parallel to a direction of a static magnetic field $B_0$; when viewed in the direction of the static magnetic field $B_0$, the 2n of antenna units are radially distributed, adjacent antenna units are spaced apart from each other at an angle, and all the antenna units as a whole form a symmetrical array;
   an overall profile of the radio-frequency coil, defined by the curved antenna units, is a dome shape curved surface, and is open on its bottom side, wherein the open side is formed by connecting the end ring segments at two ends of the antenna units and the capacitors in series alternately.

2. The radio-frequency coil according to item 1 as described above, wherein the curved antenna units have a circular arc or elliptic arc shape.

3. The radio-frequency coil according to item 1 or 2 as described above, wherein the curved antenna units have a shape conformal to an outer surface profile of an object to be scanned.

4. The radio-frequency coil according to any one of items 1 to 3 as described above, wherein when n=1, the angle between adjacent antenna units is less than 180°.

5. The radio-frequency coil according to any one of items 1 to 4 as described above, wherein in one plane perpendicular to the direction of the static magnetic field $B_0$, all the antenna units have the same width of cross section, and a ratio of the width to a distance between adjacent antenna units remains constant; in different planes perpendicular to the direction of the static magnetic field $B_0$, the width is gradually varied along the direction of the static magnetic field $B_0$, but the ratio of the width to a distance between adjacent antenna units still remains constant.

6. The radio-frequency coil according to any one of items 1 to 5 as described to above, wherein when n is 2 or more, all of the end ring segments and two outmost antenna units are disposed within one plane and form a planar ring, such that a loop on an opening side of the coil is planar.

7. The radio-frequency coil according to any one of items 1 to 6 as described above, wherein 2 identical radio-frequency coils are used as sub-coils and are connected in parallel with capacitors, an angle between the two sub-coils is 90° or approximate to 90°; the entire coil is symmetrical, the coil is fed in quadrature, and two feed ports are located at two electrodes of the capacitors in the centers of the end rings of the sub-coils respectively.

8. The radio-frequency coil according to item 7 as described above, wherein the capacitor in the middle of and connecting the two sub-coils is designed to be a tunable capacitor for balancing and decoupling.

9. The radio-frequency coil according to item 7 or 8 as described above, further comprising a balancing and decoupling circuit, which is a loop circuit formed by connecting a tunable capacitor and two antenna units on the outermost side of the coil with a conducting wire at one end of the coil.

10. The radio-frequency coil according to any one of items 1 to 9 as described above used for a high field magnetic resonance device.

The radio-frequency coil of the present disclosure is an open surface coil. The antenna units (rungs) of such a coil are different from those of the birdcage coil, are curved rather than straight, and are distributed symmetrically and radially at an angle. The coil as a whole has a dome shape, is conformal to the surface of an object to be scanned, and can be sufficiently in close proximity to the object to be scanned at two ends of the coil. In the present disclosure, a quadrature excitation mode can be applied on the above structure to generate a relatively homogeneous circular polarization radio-frequency magnetic field. When applied to the same object to be scanned, the coil of the present disclosure has smaller size (in particular, in the quadrature mode, a single sub-coil is much smaller), higher coil sensitivity, higher signal to noise ratio of the image obtained and better homogeneity, as compared to a birdcage coil.

DETAILED DESCRIPTION

The present disclosure proposes a conformal coil capable of quadrature excitation. The circuit of the conformal coil is derived from a portion of the circuit of a birdcage coil, but the antenna units are curved, and the coil is open at one end. The overall shape of the coil is topologically transformed to a dome shape according to an outer profile of an object to be scanned, wherein the antenna units of the coil are curved such that the coil is sufficiently in close proximity to the object to be scanned. The coil can not only implement a linear excitation to obtain a linear polarization radio-frequency field in a homogeneous mode, but also implement a quadrature excitation mode and perform balancing and decoupling to obtain a more homogeneous and stronger circular polarization radio-frequency field, thereby increasing the homogeneity of the radio-frequency field and the signal to noise ratio of the image.

Figure 1:
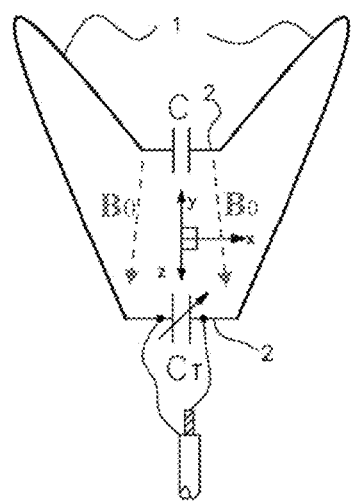
FIG. 1 is a schematic diagram of the simplest conformal coil of the present disclosure.

FIG. 1 shows the simplest conformal coil of the present disclosure. The simplest conformal coil is consisted of two curved antenna units 1, conductor end ring segments 2 connected to the antenna units, a capacitor C and a tunable capacitor $C_T$. The capacitance of the capacitor C depends on the resonance frequency of the magnetic resonance and the electromagnetic characteristic modulus of the coil. The tunable capacitor $C_T$ functions to conveniently adjust the resonance frequency of the coil to the magnetic resonance frequency in application, and has a capacitance approximately equal to that of the capacitor C. The antenna units 1 may be antenna units such as conducting wires, microstrips and the like, and have the same circular arc shape, said shape may be designed in advance according to an outer surface profile of an object to be scanned. Both planes in which two arc antenna units each are located are parallel to a $B_0$ direction (the positive direction of the z axis in the figure, i.e., a direction from the capacitor C to the capacitor $C_T$), and there is an angle (except 180°) between the two planes. When viewed in the direction of the static magnetic field $B_0$, the two antenna units are spaced apart at an angle and radially and symmetrically distributed. A feed port of the simplest conformal magnetic resonance coil may be disposed at two electrodes of the tuable capacitor $C_T$ or the capacitor C. This coil is in a linear excitation mode, and its radio-frequency magnetic field $B_1$ is linearly polarized. On two sides of the simplest conformal coil, more curved antenna units may be added at an angle and connected with end ring segments and capacitors, to form a symmetrical multi-ring coil. The number of the antenna units is a multiple of 2. The greater the number of the antenna units, the larger the region covered is, or the more densely the antenna units are distributed. However, too many antenna units will result in complex manufacture process and increased cost. Therefore, the number of the antenna units is generally controlled to be 100 or less, preferably 50 or less, and more preferably 20 or less. The overall shape of the radio-frequency coil depends on the curved shape of the antenna units, and is conformally designed to be a dome shape according to an outer profile shape of an object to be scanned. The circuit of the coil is similar to a portion of the circuit of a birdcage coil. However, the coil does not constitute a closed body coil, but is an open surface coil. Such a structure has higher sensitivity than that of a single ring, is more compact than the birdcage, has relatively small noise, and still has a homogeneous electromagnetic field characteristic modulus similar to that of the birdcage. The structure can be utilized in magnetic resonance, and is favorable for magnetic resonance imaging.

The coil of the present disclosure can implement a linear excitation by feeding at two eletrodes of the capacitor in the center of one end of the coil, to excite a linear polarization radio-frequency field. However, the linear polarization radio-frequency field cannot be sufficiently utilized by the magnetic resonance. The linear polarization field can be divided into circular polarization radio-frequency fields in two rotation directions. Only a circular polarization field in one direction can effectively participate in the magnetic resonance effect, and a circular polarization field in the other direction can be regarded as the increased loss. Therefore, in order to achieve a signal with the same intensity, a linear polarization field requires greater excitation power, and the homogeneity of a linear polarization field is worse than that of a quadrature polarization. The coil of the present disclosure can not only generate a linear polarization field, but also obtain a stronger circular polarization radio-frequency field in an effective rotation direction by means of a quadrature feed manner, thereby further improving the efficiency of the coil. If the number of the antenna units is four or more, the coil may be equivalently regarded as being formed by combining two same and independent sub-coils on left and right sides respectively. When viewed in a direction parallel to the z axis, the two equivalent sub-coils are arranged at a preferred angle approximate to 90° and are connected in parallel with a capacitor to form a quadrature surface coil. The capacitance thereof is determined in view of the fact that the frequency corresponding to the available electromagnetic characteristic modulus of the equivalent sub-coils is the magnetic resonance frequency. In practical use, between the two equivalent sub-coils, the middlemost or outermost two antenna units are connected with a tunable capacitor to form a balancing and decoupling circuit, which can adjust the imbalance caused by different loads and various errors and the coupling between two channels. The quadrature feed ports may be disposed at two electrodes of the capacitors in the centers of the same ends of respective equivalent sub-coils. The two equivalent sub-coils are decoupled, as a result, the equivalent electrical size is smaller than that of the integrated coil and much smaller than that of the birdcage. In summary, the signal to noise ratio of the image and the radio-frequency homogeneity obtained with the coil of the present disclosure can be improved.

Figure 2:
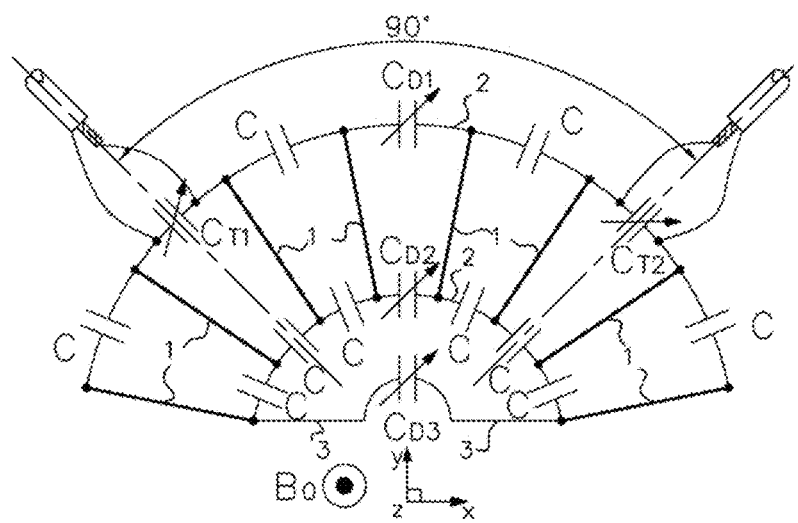
FIG. 2 is a view of a quadrature conformal coil applicable for brains of rats and mice in a $B_0$ direction.
Figure 3:
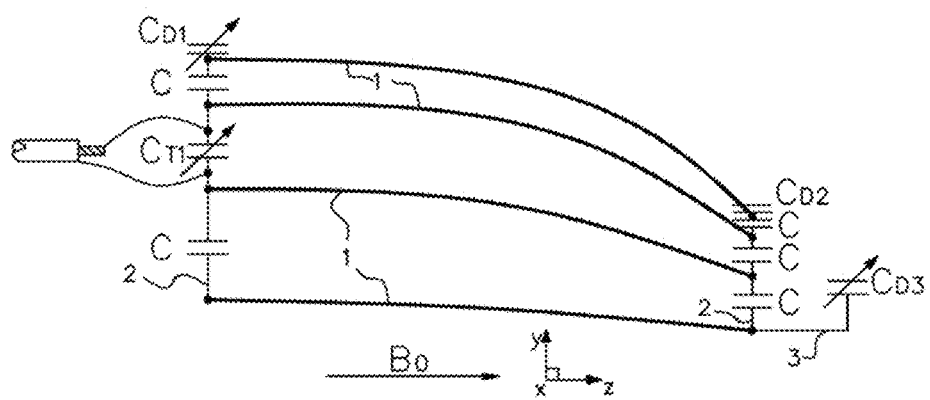
FIG. 3 is a left view of the coil as shown in FIG. 2.
Figure 4:
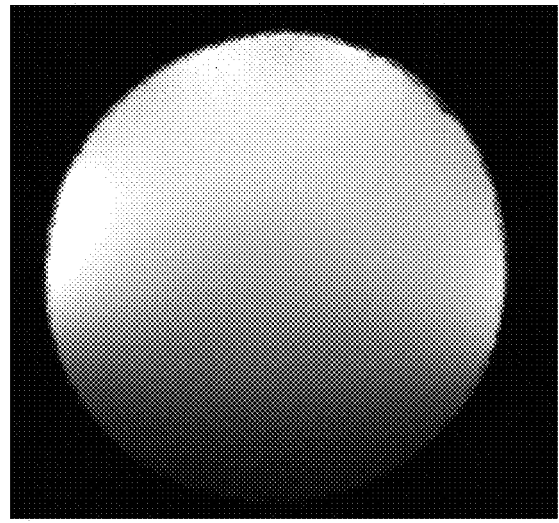
FIG. 4 is a magnetic resonance image obtained by applying the coil as shown in FIG. 2 to a 0.4% NaCl solution phantom.
Figure 5:
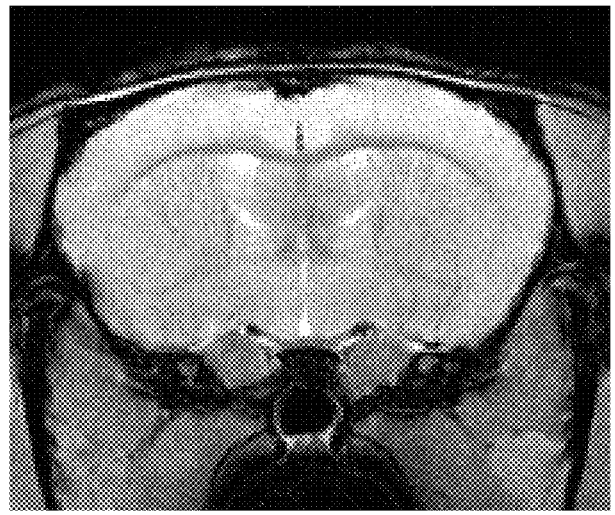
FIG. 5 is a magnetic resonance image obtained by applying the coil as shown in FIG. 2 to the brain of a mouse.

FIG. 2 shows a particular example of a quadrature conformal coil applicable to brains of rats or mice, and the schematic diagram is a view in a $B_0$ direction (the positive direction of the z axis in the figure). FIG. 3 is a left view of the coil as shown in FIG. 2. The coil of this particular example has 8 antenna units 1, 10 capacitors C, tunable capacitors $C_{T1}$ and $C_{T2}$ for tuning, and tunable capacitors $C_{D1}$, $C_{D2}$ and $C_{D3}$ for balancing and decoupling. The antenna units are connected to the C, $C_{D1}$, $C_{D2}$, $C_{T1}$ and $C_{T2}$ via the conductor end ring segments 2. $C_{D3}$ is connected to two outermost antenna units via the conducting wire 3. From a viewpoint of the structure, all the curved antenna units (as shown in FIG. 3) have a radian set according to the outer profile surface of brains of rats or mice, have the same shape, are spaced apart at an angle (as shown in FIG. 2), and distributed in a radial and symmetrical array. Here, two end rings formed by connecting the end ring segments 2 and the capacitors C, $C_{D1}$, $C_{D2}$, $C_{T1}$, and $C_{T2}$ are semicircle arc with unequal radii, wherein the end ring with a smaller radius is towards a direction of the mouth of the rat or mouse, while the end ring with a larger radius is towards a direction of the body. Such a conformal structure allows the coil to be sufficiently fitted with the outer profile of the head of the rat or mouse. The conducting wire 3 for connecting $C_{D3}$ is also made to be curved to avoid the blockage of the object to be scanned. From a viewpoint of the circuit, if the conducting wire 3 and the balancing and decoupling capacitor $C_{D3}$ of the decoupling loop circuit are not counted, the coil of FIG. 2 can be formed by developing the coil of FIG. 1. The circuit of the coil is similar to a half of the circuit of the birdcage with 16 legs, and has an available homogeneous electromagnetic field characteristic modulus. The coil is a quadrature coil. When feeding is performed on $C_{T1}$ and $C_{T2}$, it is possible to form a quadrature excitation. The coil is equivalent to one formed by connecting two conformal coils on left and right sides at an angle of 90°, each conformal coil having 4 antenna units. The adjustment of the length and orientation of the conducting wire 3, or the adjustment of the capacitances of the capacitors $C_{D1}$, $C_{D2}$ and $C_{D3}$ can allow two quadrature channels to be sufficiently balanced and decoupled, such that the circular polarization is maximized. FIG. 4 is a magnetic resonance image obtained by applying the coil to a 0.4% NaCl solution phantom. The slice thickness is 1 mm, and the image resolution is 80 μm. It can be seen that the homogeneity can meet the requirements for magnetic resonance imaging. FIG. 5 is a 9.4 T magnetic resonance image obtained by applying the coil to the brain of a mouse. The slice thickness is only 0.5 mm, and the image resolution is 80 μm. Thus, some blood vessels can be identified, and the signal to noise ratio of the image is higher than that of the traditional birdcage.

Figure 6:
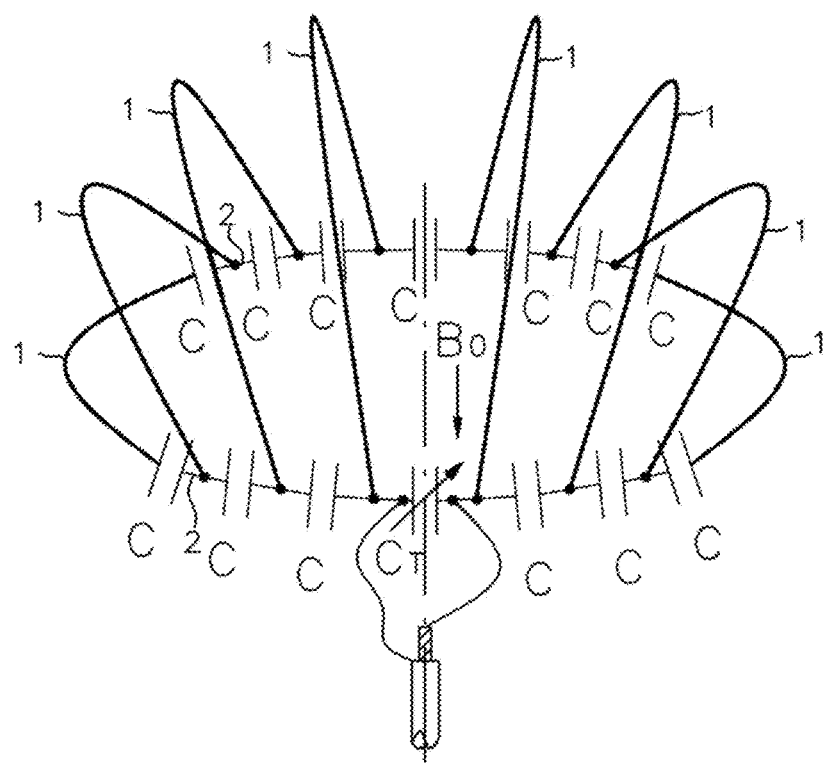
FIG. 6 is a schematic diagram of a linear conformal coil applicable for brains of humans or monkeys.

FIG. 6 is a schematic diagram of a linear conformal coil applicable for brains of humans or monkeys. The coil is consisted of 8 curved antenna units 1, 12 end ring segments 2 connected to two ends of the antenna units, 13 capacitors C, and 1 tunable capacitor $C_{T1}$. The two outermost antenna units, all the end ring segments 2, the capacitors C, and the tunable capacitor $C_{T1}$ form a ring within one plane. All the antenna units are spaced apart radially and distributed symmetrically in an array. The curved surfaces are conformal to the brain of a human or a monkey. The excitation ports are disposed at two electrodes of the tunable capacitor $C_{T1}$ in the center of the coil, similar to that of the simplest conformal coil as shown in FIG. 1. The coil is a kind of linear coil. Because there are more antenna units 1 and capacitors C as compared to the simplest conformal coil as shown in FIG. 1, the homogeneity of the radio-frequency magnetic field in the space enclosed by the coil is better, and the sensitivity is higher.

Figure 7:
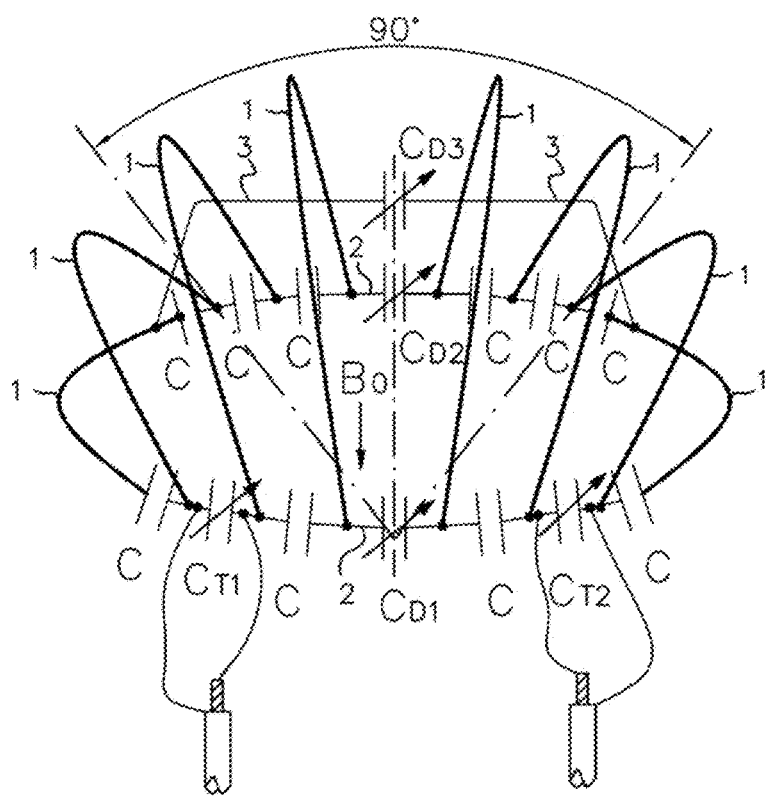
FIG. 7 is a schematic diagram of a quadrature conformal coil applicable for brains of humans or monkeys.

FIG. 7 is a schematic diagram of a quadrature conformal coil applicable for brains of humans or monkeys. The antenna units and the end ring segments are the same as those of the coil as shown in FIG. 6. There are 8 arc antenna units 1 and 12 end ring segments 2 in total. The main difference lies in the circuit. The circuit is similar to that of the quadrature coil of FIG. 2, having 10 capacitors C, 2 tunable capacitors $C_{T1}$ and $C_{T2}$, 3 balancing and decoupling capacitors $C_{D1}$, $C_{D2}$ and $C_{D3}$, and a conducting wire 3 for connecting $C_{D3}$ and the antenna units. The capacitances of C, $C_{T1}$ and $C_{T2}$ depend on both the available electromagnetic characteristic modules of the coil and the magnetic resonance frequency. $C_{D1}$, $C_{D2}$ and $C_{D3}$ may be finely tuned according to the balancing and decoupling degree tested in practical use. The coil can be equivalently regarded as one formed by connecting two identical sub-coils with 4 antenna units on left and right sides, each being fed at two ends of the tunable capacitor $C_T$ in the center thereof. Preferred angle between antenna units 1 can allow the coil to excite a circular polarization radio-frequency magnetic field $B_1$ as strong as possible and as homogeneous as possible. The structure conformal to brains and the implement of quadrature excitation increase the sensitivity of the coil.

Figure 8:
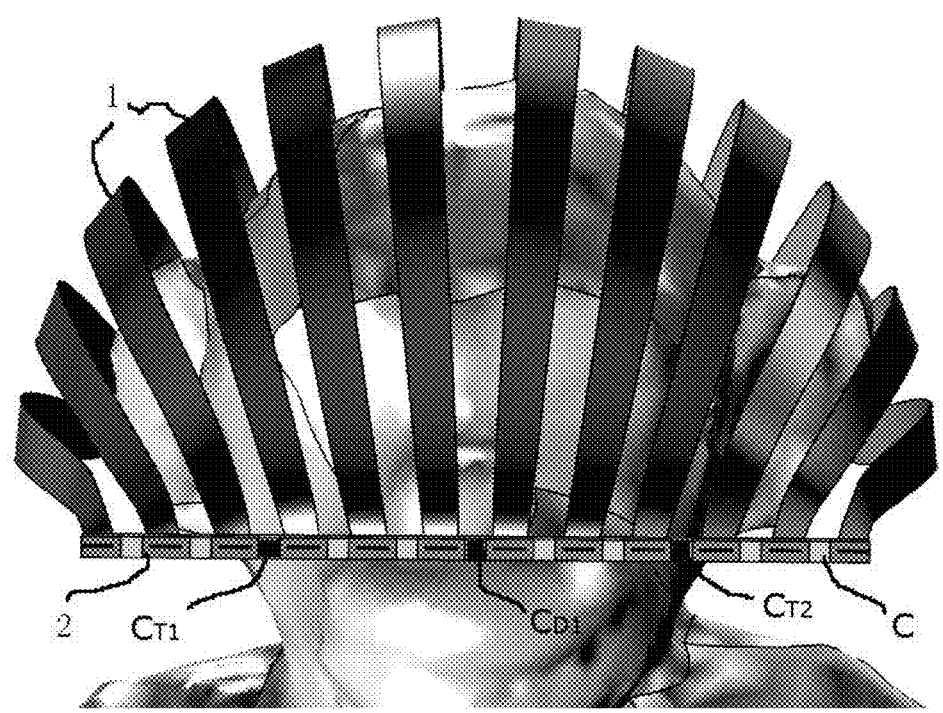
FIG. 8 is a schematic structural diagram of a conformal coil including 12 unequal-width antenna units.
Figure 9:
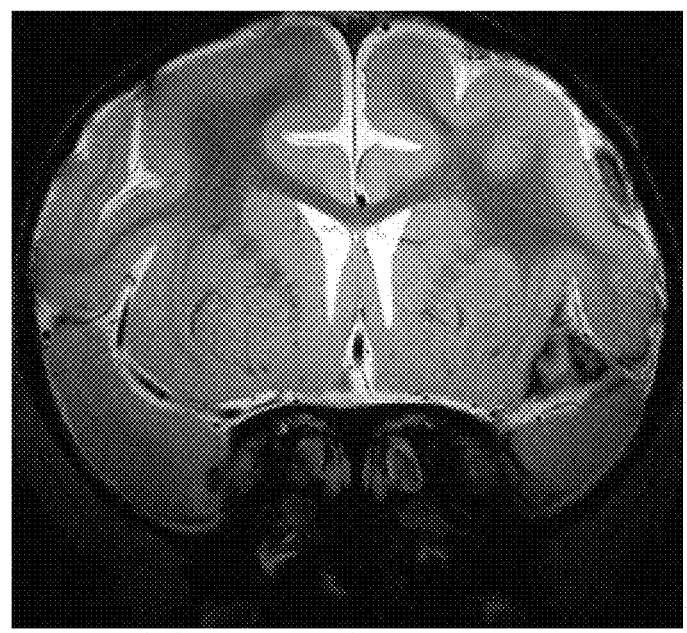
FIG. 9 is a cross section magnetic resonance image obtained by applying the coil as shown in FIG. 8 to the brain of a monkey.
Figure 10:
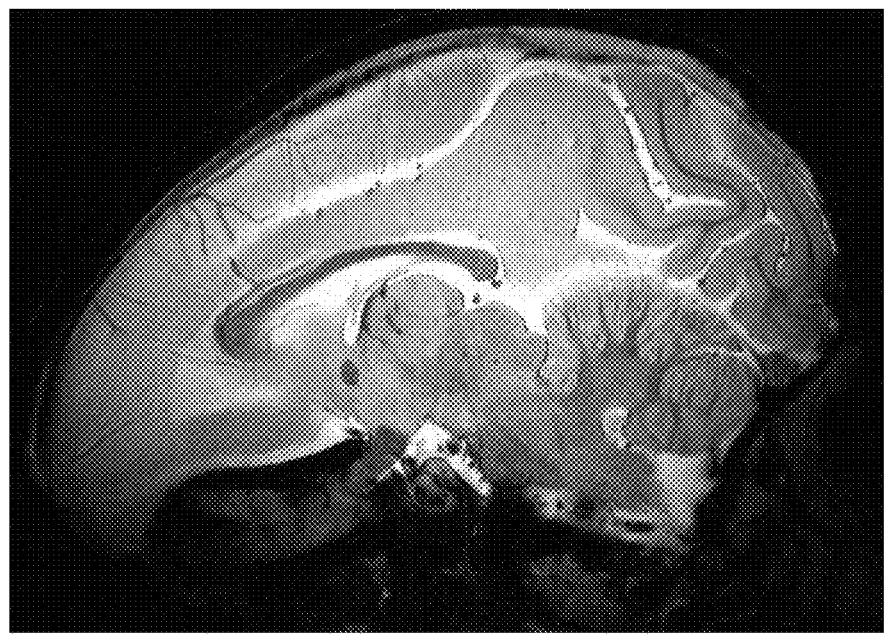
FIG. 10 is a sagittal section magnetic resonance image obtained by applying the coil as shown in FIG. 8 to the brain of a monkey.

FIG. 8 is a schematic structural diagram of a conformal coil including 12 unequal-width antenna units applicable for monkey brains or human brains, wherein the head model is the head of a monkey. The antenna units are connected with end ring segments 2 and capacitors C, $C_{T1}$, $C_{T2}$, and $C_{D1}$ at two ends. Here, $C_{T1}$ and $C_{T2}$ are respectively located in the centers of two sub-coils on left and right sides, and $C_{D1}$ is located in the center of the whole coil. The antenna units 1 are made from metal copper foil, and are distributed apart from each other at an angle. Each antenna unit is a curved arc metal foil, and the radian thereof is conformal to an outer profile of a brain to be scanned. Two outermost antenna units and the semi-end rings at two ends are disposed in one plane and form a planar ring. The width of each antenna unit is the smallest at two ends, gradually increased towards the center, and is the largest at the center, but a ratio of the width to a distance between adjacent antenna units remains constant. The width of the antenna unit is related to the sensitivity of the coil. Generally, large width results in high sensitivity, but the parasitic capacitance will increase accordingly. Therefore, the antenna unit cannot be too wide. The width will also influence the equivalent inductance of the coil. Wide antenna unit has a small inductance, favorable for reducing the loss of the coil. Wide antenna unit also has a relatively homogeneous radio-frequency magnetic field at the edge of the coil. Therefore, generally, it is beneficial for imaging to keep the wide antenna unit as much as possible. Keeping the ratio of the antenna unit width to the distance between adjacent antenna units constant can keep the imaging of the coil having a consistent homogeneity in each x-y plane. Thus, the width of the antenna unit is small at two ends of the coil and the distance is also small, while the width of the antenna unit is large in the center of the coil and the distance is also large. This particular example is a quadrature coil, wherein ports are respectively disposed at two electrodes of the capacitors $C_{T1}$ and $C_{T2}$ as shown in the figure, and an angle of 90° is formed between two equivalent sub-coils on left and right sides with respect to the brain to be scanned. $C_{D1}$ is a tunable decoupling capacitor, and the remaining capacitors are C. The coil of this particular example is smaller than a birdcage coil useful for the same brain of a living body, and the open side thereof is convenient for performing operations. The homogeneous radio-frequency field region thereof can completely cover a brain region to be scanned. The coil has high filling ratio without too many redundancies, and the signal to noise ratio of the image is higher than that of the birdcage. This particular example is applied in high field 9.4 T monkey brain imaging. FIGS. 9 and 10 are a cross section image and a sagittal section image respectively. The slice thickness is 1 mm, and an image resolution of 0.15 mm or less can be obtained.

The invention claimed is:

1. A radio-frequency coil for a magnetic resonance device, comprising:

i. 2n of curved antenna units, wherein n is an integer of 1 or more;
ii. conductor end ring segments connected to two ends of the antenna units; and
iii. capacitors connecting adjacent end ring segments,
wherein each antenna unit of the 2n of antenna units is curved the same as or similar to each other in a plane parallel to a direction of a static magnetic field $B_0$, and all the 2n of antenna units are not intersected with each other; when viewed in the direction of the static magnetic field $B_0$, the 2n of antenna units are radially distributed, adjacent antenna units are spaced apart from each other at an angle, and all the antenna units as a whole form a symmetrical array;
an overall profile of the radio-frequency coil, defined by the curved antenna units, is a dome shape curved surface, and is open on its bottom side, wherein the open side is formed by connecting the end ring segments at two ends of the antenna units and the capacitors in series alternately.

2. The radio-frequency coil according to claim 1, wherein the curved antenna units have a circular arc or elliptic arc shape.

3. The radio-frequency coil according to claim 1, wherein the curved antenna units have a shape conformal to an outer surface profile of an object to be scanned.

4. The radio-frequency coil according to claim 1, wherein when n=1, the angle between adjacent antenna units is less than 180°.

5. The radio-frequency coil according to claim 1, wherein in one plane perpendicular to the direction of the static magnetic field $B_0$, cross sections of all the antenna units have the same width, and a ratio of the width to a distance between any two adjacent antenna units in this plane is constant; in different planes perpendicular to the direction of the static magnetic field $B_0$, the width of each antenna unit is gradually varied along the direction of the static magnetic field $B_0$, but the ratio of the width to a distance between any two adjacent antenna units in each plane of the different planes remains constant.

6. The radio-frequency coil according to claim 1, wherein when n is 2 or more, all of the end ring segments and two outmost antenna units are disposed within one plane and form a planar ring, such that a loop on an opening side of the coil is planar.

7. The radio-frequency coil according to claim 1, wherein 2 identical radio-frequency coils are used as sub-coils and are connected in parallel with capacitors, an angle between the two sub-coils is 90° or approximate to 90°; the entire coil is symmetrical, the coil is fed in quadrature, and two feed ports are located at two electrodes of the capacitors in the centers of the end rings of the sub-coil respectively.

8. The radio-frequency coil according to claim 7, wherein the capacitor in the middle of and connecting the two sub-coils is designed to be a tunable capacitor.

9. The radio-frequency coil according to claim 7, further comprising a balancing and decoupling circuit, which is a loop circuit formed by connecting a tunable capacitor and two antenna units on the outermost side of the coil with a conducting wire at one end of the coil.

10. The radio-frequency coil according to claim 1 used for a high field magnetic resonance device.

11. The radio-frequency coil according to claim 2 used for a high field magnetic resonance device.

12. The radio-frequency coil according to claim 3 used for a high field magnetic resonance device.

13. The radio-frequency coil according to claim 4 used for a high field magnetic resonance device.

14. The radio-frequency coil according to claim 5 used for a high field magnetic resonance device.

15. The radio-frequency coil according to claim 6 used for a high field magnetic resonance device.

16. The radio-frequency coil according to claim 7 used for a high field magnetic resonance device.

17. The radio-frequency coil according to claim 8 used for a high field magnetic resonance device.

\* \* \* \* \*